(12) United States Patent
Aldereguia et al.

(10) Patent No.: US 8,560,807 B2
(45) Date of Patent: Oct. 15, 2013

(54) ACCESSING A LOGIC DEVICE THROUGH A SERIAL INTERFACE

(75) Inventors: Alfredo Aldereguia, Cary, NC (US);
James J. Parsonese, Cary, NC (US);
Grace A. Richter, Raleigh, NC (US);
Christopher L. Wood, Greenville, NC (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 13/325,432

(22) Filed: Dec. 14, 2011

(65) Prior Publication Data
US 2013/0159592 A1 Jun. 20, 2013

(51) Int. Cl.
*G06F 12/00* (2006.01)

(52) U.S. Cl.
USPC .......................................................... 711/217

(58) Field of Classification Search
None
See application file for complete search history.

(56) References Cited

U.S. PATENT DOCUMENTS

| | | | |
|---|---|---|---|
| 5,214,607 A | 5/1993 | Duzan | |
| 5,471,640 A | 11/1995 | McBride | |
| 5,555,424 A | 9/1996 | Sederlund et al. | |
| 5,699,087 A | 12/1997 | Krenik et al. | |
| 6,519,692 B1 | 2/2003 | Sheier et al. | |
| 6,816,921 B2 | 11/2004 | Jahnke et al. | |
| 6,823,505 B1 | 11/2004 | Dowling | |
| 6,988,163 B2 | 1/2006 | Malueg et al. | |
| 7,165,126 B2 | 1/2007 | Fukawa et al. | |
| 7,174,442 B2 * | 2/2007 | Lancaster et al. | 711/213 |
| 8,296,498 B2 * | 10/2012 | Gorobets et al. | 711/103 |
| 2002/0062408 A1 | 5/2002 | Jahnke et al. | |
| 2009/0249024 A1 | 10/2009 | Jones et al. | |

OTHER PUBLICATIONS

Cong et al., "FlowMap: An Optimal Technology Mapping Algorithm for Delay Optimization in Lookup-Table Based FPGA Designs", IEEE Transactions on Computer-Aided Design of Integrated Circuits and Systems (CAD), Jan. 1994, pp. 1-12, vol. 13 Issue 1, Institute of Electrical and Electronics Engineers (IEEE), Digital Object Identifier: 10.1109/43.273754, USA.

Murgai et al., "Logic Synthesis for a Single Large Look-up Table", Proceedings,1995 IEEE International Conference on Computer Design: VLSI in Computers and Processors (ICCD '95), Oct. 1995, pp. 415-424, Institute of Electrical and Electronics Engineers (IEEE), Digital Object Identifier: 10.1109/ICCD.1995.528842, USA.

* cited by examiner

*Primary Examiner* — Hiep Nguyen
(74) *Attorney, Agent, or Firm* — Edward J. Lenart; Cynthia G. Seal; Biggers & Ohanian, LLP

(57) ABSTRACT

Methods, apparatuses, and computer program products for accessing a logic device through a serial interface are provided. Embodiments include receiving, by the serial interface of the logic device, a first data access request indicating a non-linear address mode, wherein the first data access request includes: a non-linear address corresponding to a non-linear index specifying a plurality of non-linear addresses, the non-linear index associating each non-linear address with one of the plurality of registers; a data count indicating an amount of data to be accessed in the first data access request; and a page offset value indicating within a register, a starting page to perform the first data access request. Embodiments also include identifying in the non-linear address mode a location within the logic device based on the non-linear address and the starting page; and performing at the identified location, by the logic device, a serial transaction in accordance with the first data access request.

20 Claims, 6 Drawing Sheets

ACCESSING A LOGIC DEVICE THROUGH A SERIAL INTERFACE

BACKGROUND OF THE INVENTION

1. Field of the Invention

The field of the invention is data processing, or, more specifically, methods, apparatuses, and computer program products for accessing a logic device through a serial interface.

2. Description of Related Art

Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas that has seen considerable advancement is the use of serial interfaces, as it decreases the number of signals used, thus allowing for a smaller package. This has been facilitated by the use of programmable logic devices or 'PLDs.' PLDs are used for glue logic, power control, translation of interfaces such as I2C to SPI, debugging interfaces, isolation of failed boards, a variety of boot functions and power-on-self-test or 'POST' and for many other system-level computer operation functions known to those of skill in the art. The exact use of any particular PLD changes from one computer design to another—as well as within any particular computer design from time to time. This is a particular strength of PLDs—that system designers can change their functions even within the same system over time as needs evolve or designs improve.

One function that PLDs perform is quick memory storage. For example, serial presence data may be stored in a PLD, such as a field programmable gate array (FPGA), for access by a service processor prior to the system boot. In this example, to retrieve the data from the FPGA, the service processor may transmit to the FPGA through a serial interface, a read transaction that includes an address within the FPGA. In a FPGA addressed in a linear address mode, each block of memory is assigned a linear address. The number of linear addresses available to a FPGA is limited by the size of a linear address. Increasing the size of each linear address increases the overhead in processing data access requests. As a consequence of operating in the linear address mode, the capabilities of PLDs are limited.

SUMMARY OF THE INVENTION

Methods, apparatuses, and computer program products for accessing a logic device through a serial interface are provided. In a particular embodiment of the present invention, a logic device is configured to be addressed in either a linear address mode or a non-linear address mode. Sections of the logic device addressed in the non-linear address mode have non-linear addresses, each of which corresponds to a storage location of a register. According to this embodiment of the present invention, upon receiving a data access request, a logic device examines a mode selection bit within the data access request to determine if the data access request corresponds to a location addressed in the non-linear address mode or the linear address mode. If the data access request is in the non-linear address mode, the data access request also includes a non-linear address; a data value indicating an amount of data to be access in the data access request; and a page offset value indicating within a register, a starting page to perform the data access request. This type of addressing provides a number of benefits. In particular, a data request in the non-linear address mode may reference data in a portion of a register using an address scheme that requires fewer 'addresses' than the linear address mode, thus providing at least one benefit over the linear address mode.

In another embodiment of the present invention, embodiments include receiving, by a serial interface of a logic device, a first data access request indicating a non-linear address mode, wherein the first data access request includes: a non-linear address corresponding to a non-linear index specifying a plurality of non-linear addresses, the non-linear index associating each non-linear address with one of the plurality of registers; a data value indicating an amount of data to be accessed in the first data access request; and a page offset value indicating within a register, a starting page to perform the first data access request. Embodiments also include identifying in the non-linear address mode, by the logic device, a location within the logic device based on the non-linear address and the starting page; and performing at the identified location, by the logic device, a serial transaction in accordance with the first data access request.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
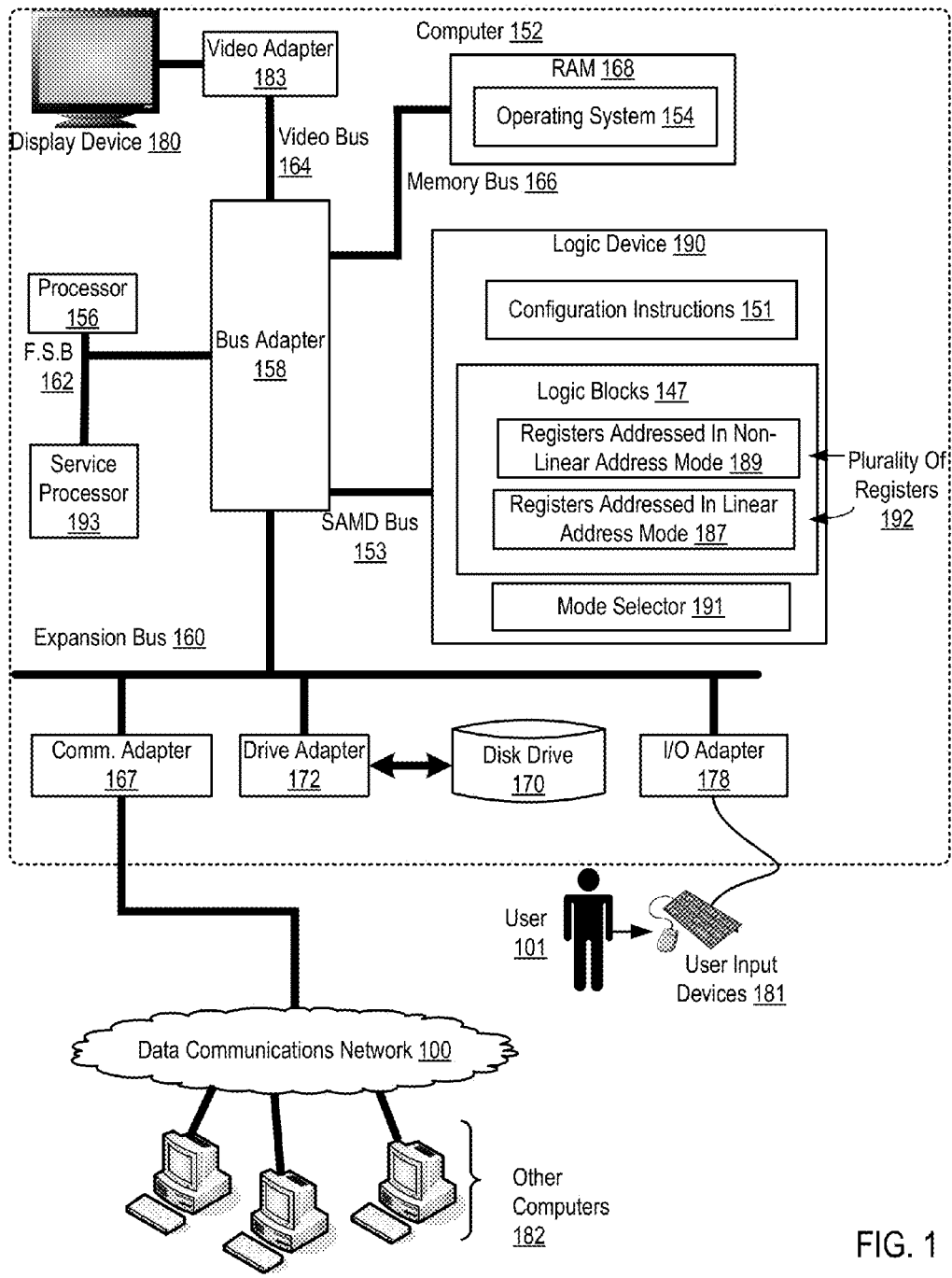
FIG. 1 sets forth a block diagram of automated computing machinery comprising an exemplary computer useful in accessing a logic device through a serial interface according to embodiments of the present invention.

Exemplary methods, apparatuses, and computer program products for accessing a logic device through a serial interface in accordance with the present invention are described with reference to the accompanying drawings, beginning with FIG. 1. Accessing a logic device through a serial interface in accordance with the present invention is generally implemented with computers, that is, with automated computing machinery. FIG. 1 sets forth a block diagram of automated computing machinery comprising an exemplary computer (152) useful in accessing a logic device through a serial interface according to embodiments of the present invention.

The computer (152) of FIG. 1 includes at least one computer processor (156) or 'CPU' as well as a service processor (193) and random access memory (168) ('RAM') which is connected through a high speed memory bus (166) and bus adapter (158) to the processor (156), the service processor (193), and to other components of the computer (152). A service processor may be a processor that is utilized during the booting of the computer (152).

In the example of FIG. 1, the computer (152) also includes a logic device (190) with a serial interface coupled for data communications to the processor (156) and the service processor (193) through the bus adapter (158). A logic device is a type of electronic component that implements digital circuits that are configurable. Some logic devices, such as programmable logic devices (PLD) also include digital circuits that are reconfigurable. In this disclosure, logic devices and programmable logic devices (PLD) may be used interchangeably.

Unlike a logic gate, or even a large network of sequential or non-sequential logic gates, which has a fixed function, a PLD has an undefined function at the time of manufacture. Before the PLD can be used in a circuit it must be programmed, that is, reconfigured. In this example, the logic device (190) includes a number of logic blocks (147) that is configured to carry out logic functions according to configuration instructions (151) installed within the logic device (190). The configuration instructions (151) typically are implemented in a hardware description language ('HDL') such as Verilog or the Very high speed integrated circuits Hardware Description Language or 'VHDL.'

Examples of PLDs include a complex programmable logic device ('CPLD'), a field programmable gate array ('FPGA'), and a programmable system-on-chip ('PSOC'). The logic blocks of a CPLD are typically so-called 'macro cells,' logic blocks that contain logic implementing disjunctive normal form expressions and more specialized logic operations. FPGAs are typically more complex and powerful that CPLDs. The logic blocks in FPGAs implement a hierarchy of reconfigurable interconnects that allow the blocks to be, in effect, wired together somewhat like a one-chip programmable breadboard. Logic blocks in FPGAs can be configured to perform complex combinational functions, or merely simple logic gates like AND and XOR. In most FPGAs, the logic blocks also include storage elements, which may be simple flip-flops or more complete blocks of storage, such as registers. For example, the logic device (190) includes a plurality of registers (192) for storing data. In the example of FIG. 1, the plurality of registers (192) includes a first set (189) of registers addressed in a non-linear address mode and a second set (187) of registers addressed in a linear address mode.

A PSOC is one of a family of mixed-signal arrays made by Cypress Semiconductor, featuring a microcontroller and configurable integrated analog and digital peripherals. A PSOC includes a processing core implemented with an 8-bit Harvard architecture design called the MBC. PSOC logic blocks can be assigned a wide range of functions and interconnected on-chip. PSOC resembles FPGAs and CPLDs in that at power up it must be configured by loading instructions from non-volatile memory. Such PLDs typically provide on-chip or chipset non-volatile storage for their configuration instructions (151) in, for example, EEPROM or Flash memory, making such programmable logic devices a good choice in modern digital designs to perform boot time functions before handing over control to other devices not having this capability. A CPLD may even be used to load configuration data for a more complex FPGA from other external non-volatile memory, for example.

The bus adapter (158) is a chip or chipset that adapts data communications among multiple buses, in this example, among a high speed front side bus (162), a high speed video bus (164), a high speed memory bus (166), a serial interface (e.g., lower speed low pin count ('LPC') bus (153)), and a lower speed expansion bus (160). The bus adapter as a chipset could be implemented as the well known Northbridge/Southbridge with the Northbridge handling the higher speed buses and the Southbridge handling the lower speed buses. The components of such chipsets are also known as a memory controller hub ('MCH'), an integrated memory controller ('IMC'), an I/O controller hub ('ICH'), or a platform controller hub ('PCH'). There is somewhat of a trend to bundle all this functionality into a single chip, however, and so the bus adapter (158) in this example, for convenience of explanation, is described as a single device. Such bus adapters (158) each may host its own memory cache, memory lookup table, and I/O memory management unit ('MMU'), mapping the address space layout in main memory as well as the I/O addresses. Alternatively, the MMU, memory table, and memory cache may be hosted on the CPU chip itself—or in one or more separate chips or chipsets.

Stored in the logic device (190) is a request controller (191) that includes computer program instructions controlling processing of data access requests received by the logic device (190) in accordance with the present invention. According to embodiments of the present invention, the request controller (191) enables the logic device (190) to address the plurality of registers (192) in either the linear address mode or the non-linear address mode. As explained above, in the example of FIG. 1, the plurality of registers (192) include the first set (189) of registers addressed in accordance with the non-linear address mode and the second set (187) of registers addressed in accordance with the linear address mode.

The request controller (191) includes computer program instructions that when executed by the logic device (190) cause the logic device (190) to carry out the steps of: receiving, by the serial interface of the logic device (190), a first data access request indicating a non-linear address mode, wherein the first data access request includes: a non-linear address corresponding to a non-linear index specifying a plurality of non-linear addresses, the non-linear index associating each non-linear address with one of the plurality of registers; a data count indicating an amount of data to be accessed in the first data access request; and a page offset value indicating within a register, a starting page to perform the first data access request. The request controller (191) also includes computer program instructions that when executed by the logic device (190) cause the logic device (190) to carry out the steps of: identifying in the non-linear address mode, a location within the logic device based on the non-linear address and the starting page; and performing at the identified location a serial transaction in accordance with the first data access request.

Stored in RAM (168) is an operating system (154). Operating systems useful for accessing a logic device through a serial interface according to embodiments of the present invention include UNIX™, Linux™, Microsoft XP™, AIX™, IBM's i5/OS™, and others as will occur to those of skill in the art. The operating system (154) in the example of FIG. 1 is shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for accessing a logic device through a serial interface according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (183), which is an example of an I/O adapter specially designed for graphic output to a display device (180) such as a display screen or computer monitor. Video adapter (183) is connected to processor (156) through a high speed video bus (164), bus adapter (158), and the front side bus (162), which is also a high speed bus.

The exemplary computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for accessing a logic device through a serial interface according to embodiments of the present invention include modems for wired dial-up communications, Ethernet (IEEE 802.3) adapters for wired data communications network communications, and 802.11 adapters for wireless data communications network communications.

Figure 2:
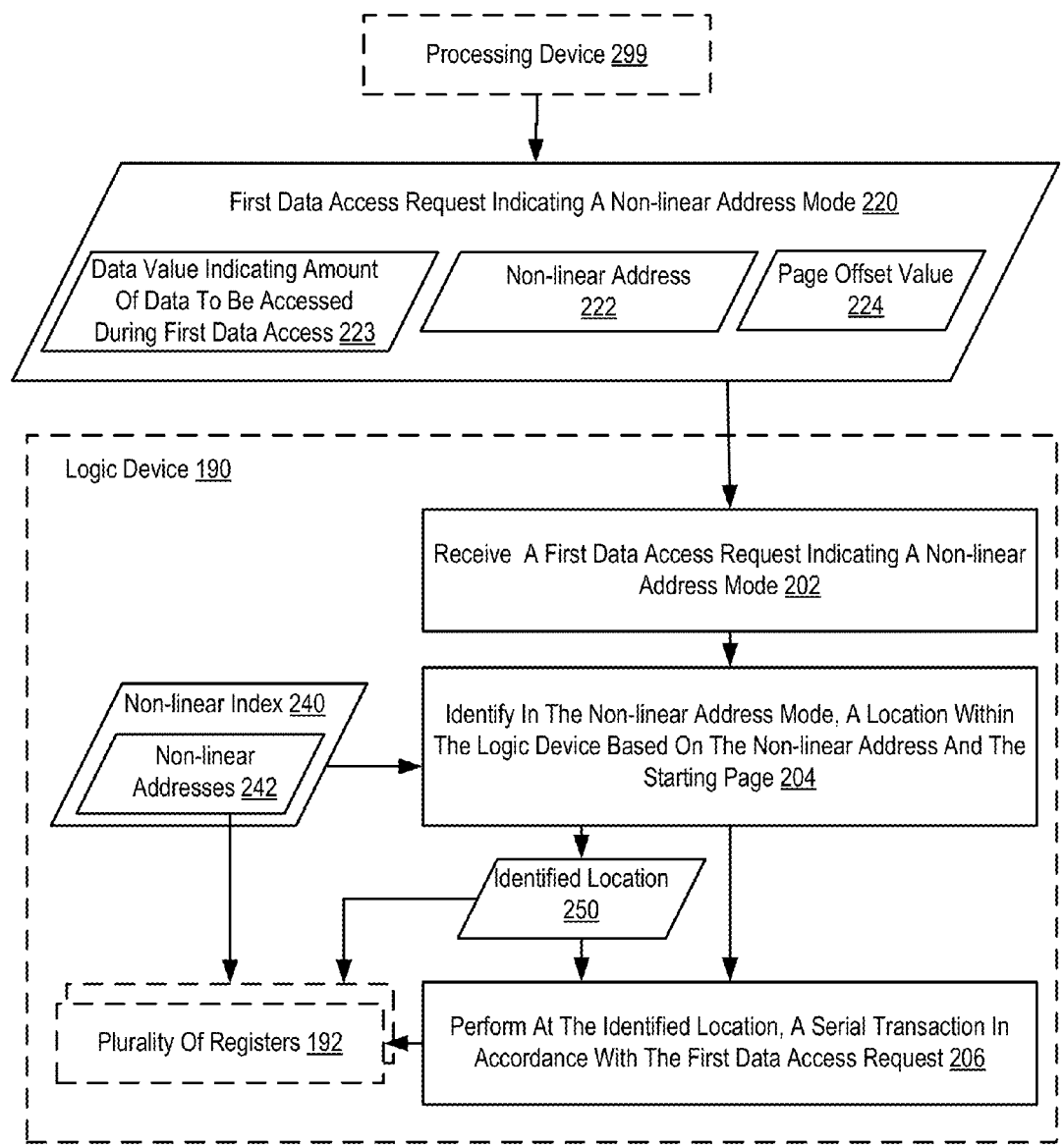
FIG. 2 sets forth a flow chart illustrating an exemplary method of accessing a logic device through a serial interface according to embodiments of the present invention.

For further explanation, FIG. 2 sets forth a flow chart illustrating an exemplary method of accessing a logic device through a serial interface according to embodiments of the present invention. The method of FIG. 2 includes receiving (202) from a processing device (299), by a serial interface of the logic device (190), a first data access request (220) indicating a non-linear address mode. A processing device may be any type of device capable of transmitting a data access request. Examples of processing devices include the processor (156) and the service processor (193) of FIG. 1. A data access request may be a type of memory operation, such as a read transaction or a write transaction. As explained above, a data access request may specify a linear address mode or a non-linear address mode. In the linear address mode, each block of memory in a section of the logic device is sequentially assigned a specific linear address. For example, a register within the logic device (190) may be addressed in the linear address mode such that each block of memory in the memory register has a sequentially assigned linear address. However, assigning each block of memory a specific linear address requires as many addresses as there are blocks of memory. In the non-linear address mode, each memory register is assigned one non-linear address. As a consequence, a logic device with memory registers addressed in accordance with the non-linear address mode uses fewer addresses than a logic device with memory registers addressed in accordance with the linear address mode. Because the non-linear address mode uses fewer addresses than the linear address mode, the size of the non-linear address for a logic device may be smaller than the size of the linear addresses needed for the same logic device.

In the example of FIG. 2, the first data access request (220) includes a non-linear address (222) corresponding to a non-linear index (240) specifying a plurality of non-linear addresses (242). The non-linear index (240) of FIG. 2 associates each non-linear address with one of the plurality of registers (192). The first data access request (220) also includes a data value (223) indicating an amount of data to be accessed during the first data access. In the example of FIG. 2, the first data access request (220) also includes a page offset value (224) indicating within a register, a starting page to perform the first data access request (220). As explained above, in the non-linear address mode, each memory register is only assigned one non-linear address. Therefore, to identify a portion of a register that is addressed in the non-linear address mode, the data within the memory register is indexed and referenced by pages. That is, the page offset value (224) serves as a pointer to a particular page within a register and the data value (223) indicates an amount of data to retrieve starting at the pointer.

Receiving (202) from the processing device (299), by the logic device (190), a first data access request (220) indicating a non-linear address mode may be carried out by receiving a read or write transaction; and examining the contents of the read or write transaction for a bit or bits indicating whether the transaction is in the non-linear address or the linear address. For example, the data access request (220) may indicate a non-linear address (222) of "0–42" and a page offset value (224) of "0–01." In this example, the logic device (190) would identify the memory register that is at the non-linear address of "0–42" and would further identify the portion of the memory register stored within the second page of the memory register.

The method of FIG. 2 includes identifying (204) in the non-linear address mode, by the logic device (190), a memory location (250) within the logic device (190) based on the non-linear address (222) and the starting page. Identifying (204) in the non-linear address mode, by the logic device (190), a memory location (250) within the logic device (190) based on the non-linear address (222) and the starting page may be carried out by determining the memory location corresponding to the non-linear address and advancing from that memory location to the indicated starting page as represented by the offset page value.

The method of FIG. 2 includes performing (206) at the identified location (250), by the logic device (190), a serial transaction in accordance with the first data access request (220). Performing (206) at the identified location (250), by the logic device (190), a serial transaction in accordance with the first data access request (220) may be carried out by in response to a read transaction, reading an amount of data, as specified by the data value (223), stored at the memory location (250) and transmitting the read data to the processing device (299); and in response to a write transaction, writing data to the memory location (250).

Figure 3:
FIG. 3 sets forth a flow chart illustrating a further exemplary method for accessing a logic device through a serial interface according to embodiments of the present invention.

For further explanation, FIG. 3 sets forth a flow chart illustrating a further exemplary method for accessing a logic device through a serial interface according to embodiments of the present invention. The method of FIG. 3 includes receiving (302) from the processing device (299), by the serial interface of the logic device (190), a second data access request (320) indicating a linear address mode. That is, the logic device (190) of FIG. 3 is capable of switching between the linear address mode and the non-linear address mode. In the example of FIG. 3, the second data access request (320) includes a linear address (322) corresponding to a linear index (340) specifying a plurality of linear addresses (342). The linear index (340) of FIG. 3 sequentially associates each linear address with a specific location within the logic device (190). Receiving (302) from the processing device (299), by the logic device (190), a second data access request (320) indicating a linear address mode may be carried out by receiving a read or write transaction; and examining the read or write transaction to determine if the transaction is in the linear address mode or the non-linear address mode.

The method of FIG. 3 includes performing (304) at the linear address (322), by the logic device (190), a serial transaction in accordance with the second data access request (320). Performing (304) at the linear address (322), by the logic device (190), a serial transaction in accordance with the second data access request (320) may be carried out by in response to a read transaction, reading data stored at the memory location (250) and transmitting the read data to the processing device (299); and in response to a write transaction, writing data to the memory location (250).

Figure 4:
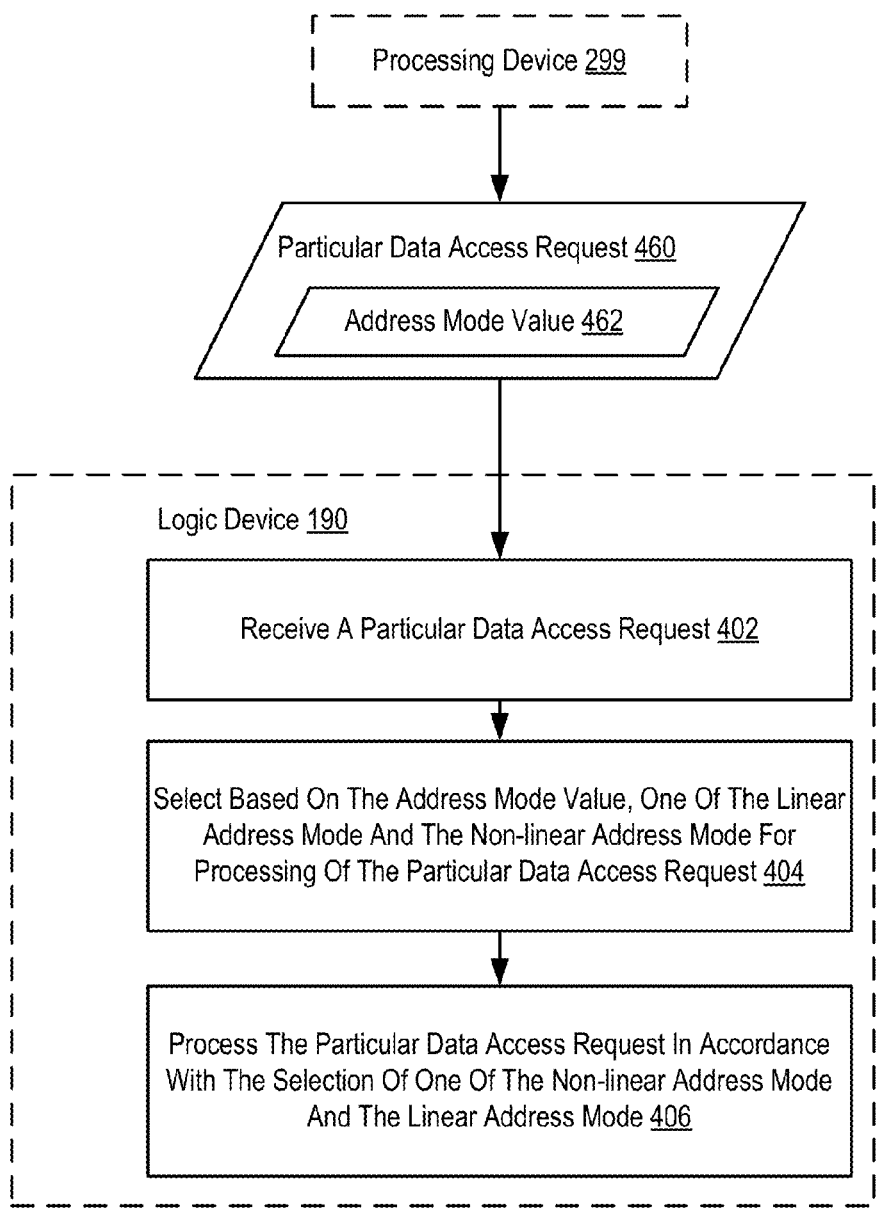
FIG. 4 sets forth a flow chart illustrating a further exemplary method for accessing a logic device through a serial interface according to embodiments of the present invention.

For further explanation, FIG. 4 sets forth a flow chart illustrating a further exemplary method for accessing a programmable logic device (PLD) according to embodiments of the present invention. The method of FIG. 4 includes receiving (402) from the processing device (299), by the logic device (190), a particular data access request (460) that includes an address mode value (462). An address mode value may be a bit or bits indicating whether the data access request is to be performed in the linear address mode or the non-linear address mode. The address mode value (460) also indicates whether the address within the data access request is a linear address or a non-linear address. As explained above, the size of the linear address and the size of a non-linear address may vary significantly.

The method of FIG. 4 includes selecting (404) based on the address mode value (462), by the serial interface of the logic device (190), one of the linear address mode and the non-linear address mode for processing of the particular data access request (460). Selecting (404) based on the address mode value (462), by the logic device (190), one of the linear address mode and the non-linear address mode for processing of the particular data access request (460) may be carried out by determining if the address mode value is a one or a zero; and setting the processing mode to either linear address mode or non-linear address mode based on that determination.

The method of FIG. 4 includes processing (406), by the logic device (190), the particular data access request (460) in accordance with the selection of one of the non-linear address mode and the linear address mode. Processing (406), by the logic device (190), the particular data access request (460) in accordance with the selection of one of the non-linear address mode and the linear address mode may be carried out by examining the contents of the data access request from an address of a particular length; and using the address to read or write data to the memory register.

Figure 5:
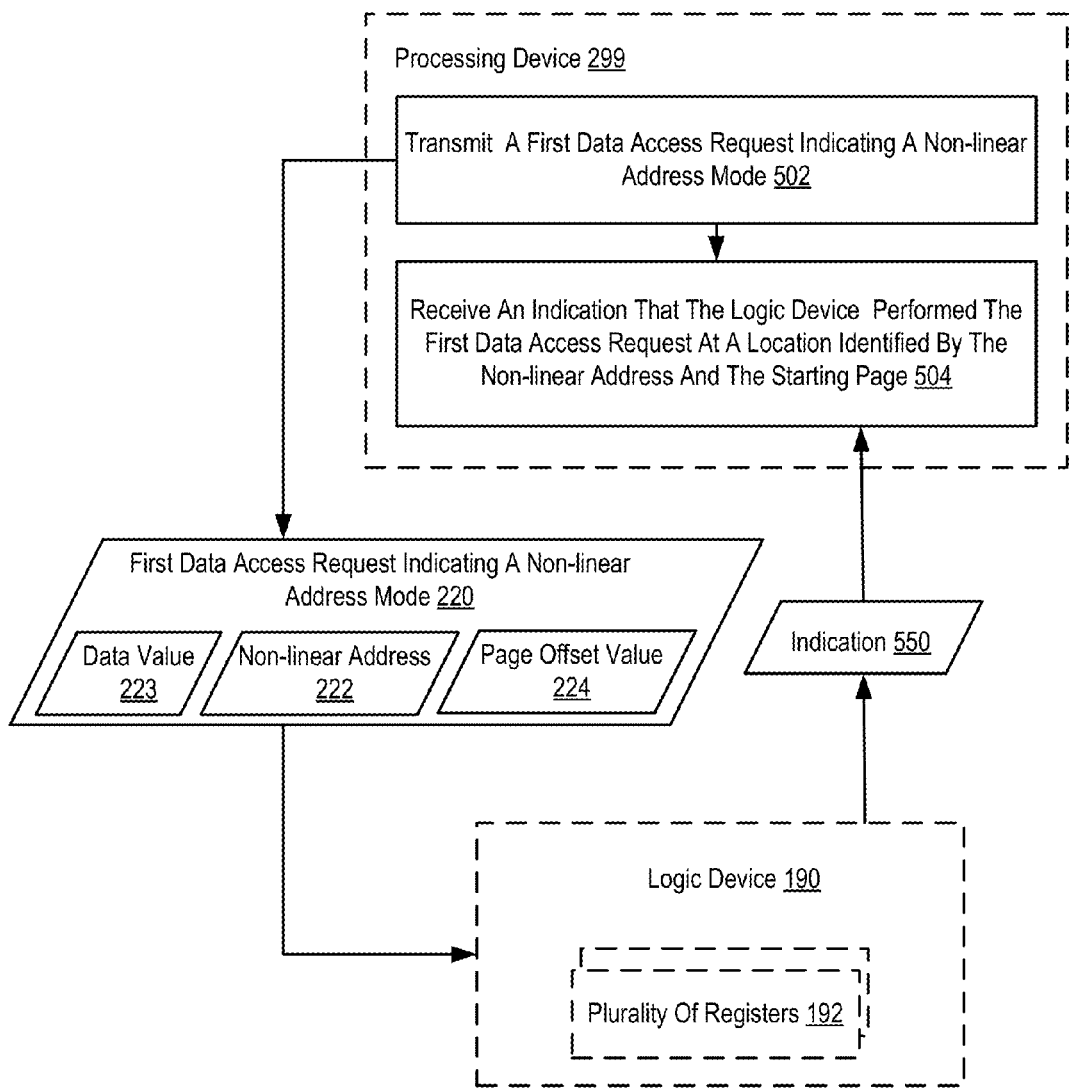
FIG. 5 sets forth a flow chart illustrating a further exemplary method for accessing a logic device through a serial interface according to embodiments of the present invention.

For further explanation, FIG. 5 sets forth a flow chart illustrating a further exemplary method for accessing a programmable logic device (PLD) according to embodiments of the present invention. The method of FIG. 5 includes transmitting (502) to the logic device (190), by the processing device (299), a first data access request (220) indicating a non-linear address mode. In the example of FIG. 5, the first data access request (220) includes a non-linear address (222) corresponding to a non-linear index (240) specifying a plurality of non-linear addresses (242). The non-linear index (240) of FIG. 5 associates each non-linear address with one of the plurality of registers (192). In the example of FIG. 5, the first data access request (220) includes a page offset value (224) indicating within a register, a starting page to perform the first data access request (220). Transmitting (502) to the logic device (190), by the processing device (299), a first data access request (220) indicating a non-linear address mode may be carried out by establishing a connection between the logic device (190) and the processing device (299); and transmitting a read or write transaction to the logic device (190).

The method of FIG. 5 includes receiving (504) from the logic device (190), by the processing device (299), an indication (550) that the logic device (190) performed the first data access request (220) at a memory location (250) identified based on the non-linear address (222) and the starting page. An indication may include a message indicating that the data access request has been performed. Receiving (504) from the logic device (190), by the processing device (299), an indication (550) that the logic device (190) performed the first data access request (220) at a memory location (250) identified based on the non-linear address (222) and the starting page may be carried out by receiving a message indicating that either the read or write transaction has been performed.

Figure 6:
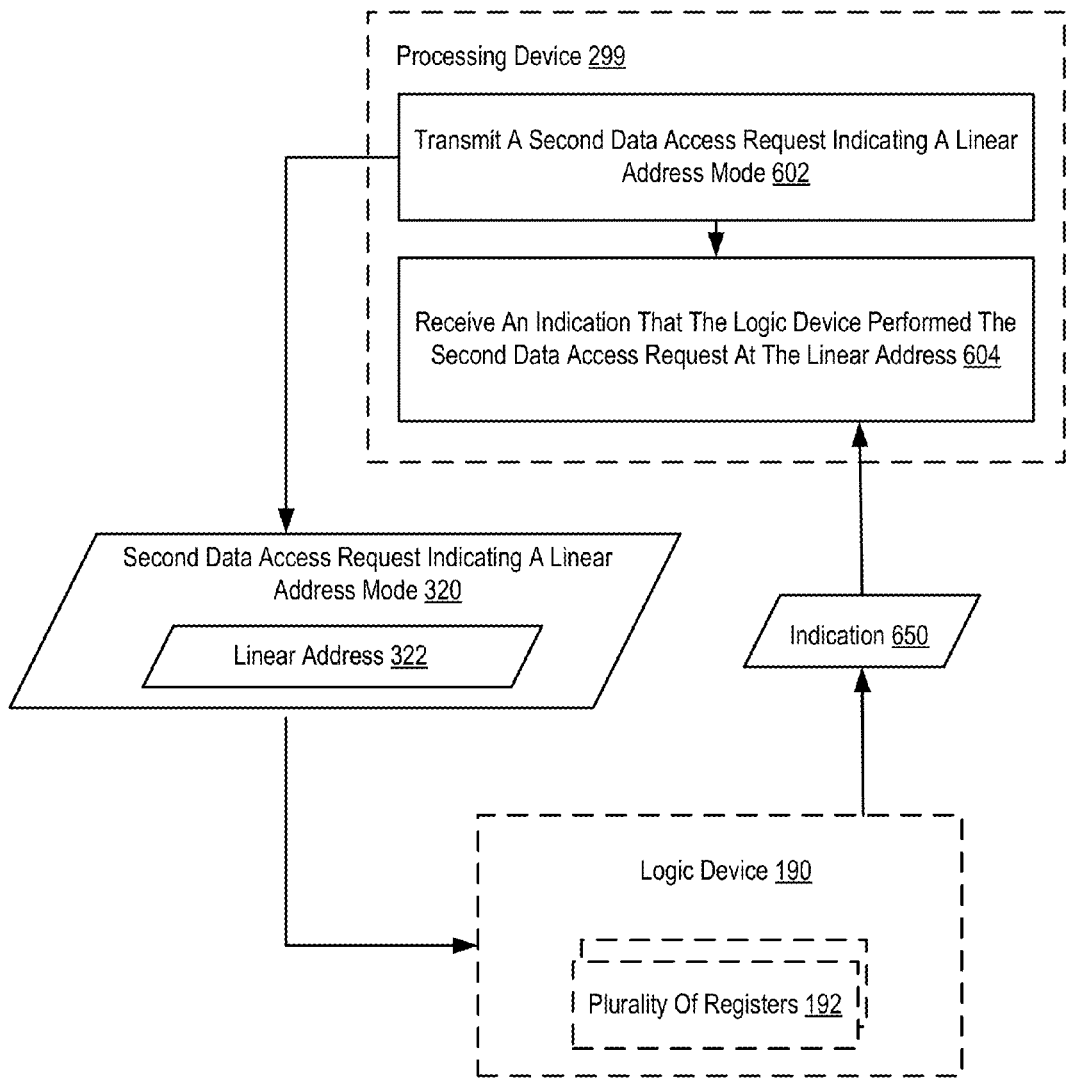
FIG. 6 sets forth a flow chart illustrating a further exemplary method for accessing a logic device through a serial interface according to embodiments of the present invention.

For further explanation, FIG. 6 sets forth a flow chart illustrating a further exemplary method for accessing a programmable logic device (PLD) according to embodiments of the present invention. The method of FIG. 6 includes transmitting (602) to the logic device (190), by the processing device (299), a second data access request (320) indicating a linear address mode (322). In the example of FIG. 6, the second data access request (320) includes a linear address (322) corresponding to a linear index (340) specifying a plurality of linear addresses (342). The linear index (340) of FIG. 6 sequentially associates each linear address with a specific location within the logic device (190). Transmitting (602) to the logic device (190), by the processing device (299), a second data access request (320) indicating a linear address mode (322) may be carried out by establishing a connection between the logic device (190) and the processing device (299); and transmitting a read or write transaction to the logic device (190).

The method of FIG. 6 includes receiving (604) from the logic device (190), by the processing device (299), an indication (650) that the logic device (190) performed the second data access request (320) at the linear address (322). Receiving (604) from the logic device (190), by the processing device (299), an indication (650) that the logic device (190) performed the second data access request (320) at the linear address (322) may be carried out by receiving a message indicating that either the read or write transaction has been performed.

Exemplary embodiments of the present invention are described largely in the context of a fully functional computer system for accessing a programmable logic device. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of accessing a logic device through a serial interface, the logic device including a plurality of registers, the method comprising:
    receiving, by the serial interface of the logic device, a first data access request indicating a non-linear address mode, wherein the first data access request includes:
        a non-linear address corresponding to a non-linear index specifying a plurality of non-linear addresses, the non-linear index associating each non-linear address with one of the plurality of registers;
        a data count indicating an amount of data to be accessed in the first data access request; and
        a page offset value indicating within a register, a starting page to perform the first data access request;
    identifying in the non-linear address mode, by the logic device, a location within the logic device based on the non-linear address and the starting page; and
    performing at the identified location, by the logic device, a serial transaction in accordance with the first data access request.

2. The method of claim 1 further comprising:
    receiving, by the logic device, a second data access request indicating a linear address mode, wherein the second data access request includes a linear address corresponding to a linear index specifying a plurality of linear addresses, the linear index sequentially associating each linear address with a specific location with the logic device;
    performing at the linear address, by the logic device, a serial transaction in accordance with the second data access request.

3. The method of claim 2 wherein the plurality of registers include a first set of registers addressed in accordance with the non-linear address mode and a second set of registers addressed in accordance with the linear address mode.

4. The method of claim 1 further comprising:
    receiving, by the logic device, a particular data access request that includes an address mode value;
    selecting based on the address mode value, by the logic device, one of the linear address mode and the non-linear address mode for processing of the particular data access request; and
    processing, by the logic device, the particular data access request in accordance with the selection of one of the non-linear address mode and the linear address mode.

5. The method of claim 1 wherein the first data access request includes an ending page offset for the performance of the first data access request.

6. The method of claim 1 wherein the logic device is a programmable logic device.

7. An apparatus for accessing a logic device through a serial interface, the apparatus comprising a computer processor, a computer memory operatively coupled to the computer processor, the computer memory having disposed within it computer program instructions that when executed by the computer processor cause the apparatus to carry out the steps of:
    receiving, by the serial interface of the logic device, a first data access request indicating a non-linear address mode, wherein the first data access request includes:
        a non-linear address corresponding to a non-linear index specifying a plurality of non-linear addresses, the non-linear index associating each non-linear address with one of the plurality of registers;
        a data count indicating an amount of data to be accessed in the first data access request; and
        a page offset value indicating within a register, a starting page to perform the first data access request;
    identifying in the non-linear address mode, by the logic device, a location within the logic device based on the non-linear address and the starting page; and
    performing at the identified location, by the logic device, a serial transaction in accordance with the first data access request.

8. The apparatus of claim 7 further comprising computer program instructions that when executed by the computer processor cause the apparatus to carry out the steps of:
    receiving, by the logic device, a second data access request indicating a linear address mode, wherein the second data access request includes a linear address corresponding to a linear index specifying a plurality of linear addresses, the linear index sequentially associating each linear address with a specific location with the logic device;
    performing at the linear address, by the logic device, a serial transaction in accordance with the second data access request.

9. The apparatus of claim 8 wherein the plurality of registers include a first set of registers addressed in accordance with the non-linear address mode and a second set of registers addressed in accordance with the linear address mode.

10. The apparatus of claim 7 further comprising computer program instructions that when executed by the computer processor cause the apparatus to carry out the steps of:
    receiving, by the logic device, a particular data access request that includes an address mode value;
    selecting based on the address mode value, by the logic device, one of the linear address mode and the non-linear address mode for processing of the particular data access request; and
    processing, by the logic device, the particular data access request in accordance with the selection of one of the non-linear address mode and the linear address mode.

11. The apparatus of claim 7 wherein the first data access request includes an ending page offset for the performance of the first data access request.

12. The apparatus of claim 7 wherein the logic device is a programmable logic device.

13. A computer program product for accessing a logic device through a serial interface, the computer program product disposed upon a computer readable medium, the computer program product comprising computer program instructions capable, when executed, of causing a computer to carry out the steps of:
    receiving, by the serial interface of the logic device, a first data access request indicating a non-linear address mode, wherein the first data access request includes:
        a non-linear address corresponding a non-linear index specifying a plurality of non-linear addresses, the non-linear index associating each non-linear address with one of the plurality of registers;
        a data count indicating an amount of data to be accessed in the first data access request; and
        a page offset value indicating within a register, a starting page to perform the first data access request;
    identifying in the non-linear address mode, by the logic device, a location within the logic device based on the non-linear address and the starting page; and
    performing at the identified location, by the logic device, a serial transaction in accordance with the first data access request.

14. The computer program product of claim 13 further comprising computer program instructions capable, when executed, of causing a computer to carry out the steps of:
- receiving, by the logic device, a second data access request indicating a linear address mode, wherein the second data access request includes a linear address corresponding to a linear index specifying a plurality of linear addresses, the linear index sequentially associating each linear address with a specific location with the logic device;
- performing at the linear address, by the logic device, a serial transaction in accordance with the second data access request.

15. The computer program product of claim 14 wherein the plurality of registers include a first set of registers addressed in accordance with the non-linear address mode and a second set of registers addressed in accordance with the linear address mode.

16. The computer program product of claim 13 further comprising computer program instructions capable, when executed, of causing a computer to carry out the steps of:
- receiving, by the logic device, a particular data access request that includes an address mode value;
- selecting based on the address mode value, by the logic device, one of the linear address mode and the non-linear address mode for processing of the particular data access request; and
- processing, by the logic device, the particular data access request in accordance with the selection of one of the non-linear address mode and the linear address mode.

17. The computer program product of claim 13 wherein the first data access request includes an ending page offset for the performance of the first data access request.

18. The computer program product of claim 13 wherein the logic device is a programmable logic device.

19. A method of accessing a logic device through a serial interface, the logic device including a plurality of registers, the method comprising:
- transmitting to the serial interface of the logic device, by a processing device, a first data access request indicating a non-linear address mode, wherein the first data access request includes:
  - a non-linear address corresponding to a non-linear index specifying a plurality of non-linear addresses, the non-linear index associating each non-linear address with one of the plurality of registers;
  - a data count indicating an amount of data to be accessed in the first data access request; and
  - a page offset value indicating within a register, a starting page to perform the first data access request;
- receiving from the serial interface of the logic device, by the processing device, an indication that the logic device performed the first data access request at a location identified by the non-linear address and the starting page.

20. The method of claim 19 further comprising:
- transmitting to the logic device, by the processing device, a second data access request indicating a linear address mode, wherein the second data access request includes a linear address corresponding to a linear index specifying a plurality of linear addresses, the linear index sequentially associating each linear address with a specific location with the logic device; and
- receiving from the logic device, by the processing device, an indication that the logic device performed the second data access request at the linear address.

* * * * *